United States Patent
Inam et al.

(10) Patent No.: US 11,812,592 B1
(45) Date of Patent: Nov. 7, 2023

(54) LIQUID COOLING OF HIGH CURRENT DEVICES IN POWER FLOW CONTROL SYSTEMS

(71) Applicant: Smart Wires Inc., Durham, NC (US)

(72) Inventors: Haroon Inam, San Jose, CA (US); Ali Farahani, Yorba Linda, CA (US)

(73) Assignee: Smart Wires Inc., Durham, NC (US)

( * ) Notice: Subject to any disclaimer, the term of this patent is extended or adjusted under 35 U.S.C. 154(b) by 0 days.

(21) Appl. No.: 17/962,034

(22) Filed: Oct. 7, 2022

Related U.S. Application Data

(62) Division of application No. 16/948,523, filed on Sep. 22, 2020, now Pat. No. 11,470,748.

(60) Provisional application No. 62/987,221, filed on Mar. 9, 2020.

(51) Int. Cl.
*H05K 7/20* (2006.01)
*H01L 23/473* (2006.01)

(52) U.S. Cl.
CPC ..... *H05K 7/20927* (2013.01); *H01L 23/4735* (2013.01); *H05K 7/20254* (2013.01); *H05K 7/20272* (2013.01)

(58) Field of Classification Search
CPC ........... H05K 7/20927; H05K 7/20254; H05K 7/20272; H05K 7/20936; H05K 7/2089; H05K 1/0203; H01L 23/473
See application file for complete search history.

(56) References Cited

U.S. PATENT DOCUMENTS

| | | | |
|---|---|---|---|
| 5,168,348 A | 12/1992 | Chu et al. | |
| 5,388,635 A | 2/1995 | Gruber et al. | |
| 5,454,351 A | 10/1995 | Cao et al. | |
| 5,811,062 A * | 9/1998 | Wegeng | F28D 9/00 366/DIG. 3 |
| 6,519,151 B2 | 2/2003 | Chu et al. | |
| 6,639,334 B2 | 10/2003 | Chen et al. | |
| 6,669,115 B2 | 12/2003 | Sun et al. | |
| 6,988,534 B2 | 1/2006 | Kenny et al. | |
| 7,362,574 B2 | 4/2008 | Campbell et al. | |
| 7,375,962 B2 | 5/2008 | Campbell et al. | |
| 7,709,296 B2 | 5/2010 | Campbell et al. | |
| 7,956,458 B2 | 6/2011 | Campbell et al. | |
| 8,659,896 B2 | 2/2014 | Dede et al. | |
| 9,131,631 B2 | 9/2015 | Joshi | |
| 9,257,365 B2 | 2/2016 | Joshi | |
| 9,484,284 B1 * | 11/2016 | Gambin | H01L 23/4735 |
| 10,533,809 B1 | 1/2020 | Sherrer et al. | |

(Continued)

*Primary Examiner* — Adam B Dravininkas
(74) *Attorney, Agent, or Firm* — Womble Bond Dickinson (US) LLP

(57) ABSTRACT

A modular liquid cooling block is described for cooling high current devices deployed in power flow control systems. The liquid cooling blocks may have separate shower heads which may be configured for direct impingement, indirect impingement, or parallel flow cooling configurations. Voltage isolation of liquid cooling blocks from an enclosure of the power flow control system and from associated equipment enables serial or parallel connected power flow control units to inject substantial reactive power that may be configurable into a power transmission line. Associated power flow control systems are monitored for temperature, flow rate and pressure gradient. Redundant pumps and fan radiators contribute to reliable operation. Automatic shutdown and alarm may be provided.

9 Claims, 7 Drawing Sheets

(56) References Cited

U.S. PATENT DOCUMENTS

| | | | |
|---|---|---|---|
| 10,566,265 | B2 | 2/2020 | Fukuoka et al. |
| 2003/0011987 | A1 | 1/2003 | Chu et al. |
| 2003/0102728 | A1 | 6/2003 | Chen et al. |
| 2003/0146301 | A1 | 8/2003 | Sun et al. |
| 2004/0062004 | A1* | 4/2004 | Pfeifer .................. H02M 7/003 257/E23.098 |
| 2007/0272392 | A1 | 11/2007 | Ghosh et al. |
| 2008/0002363 | A1 | 1/2008 | Campbell et al. |
| 2008/0037221 | A1 | 2/2008 | Campbell et al. |
| 2008/0049476 | A1* | 2/2008 | Azuma .................. B60L 50/61 361/699 |
| 2008/0062639 | A1 | 3/2008 | Campbell et al. |
| 2008/0093713 | A1 | 4/2008 | Campbell et al. |
| 2008/0259566 | A1* | 10/2008 | Fried .................. H05K 7/20809 165/80.4 |
| 2009/0032937 | A1 | 2/2009 | Mann et al. |
| 2010/0097765 | A1* | 4/2010 | Suzuki .................. B60K 6/405 361/699 |
| 2010/0172099 | A1 | 7/2010 | Campbell et al. |
| 2012/0063091 | A1 | 3/2012 | Dede et al. |
| 2013/0333388 | A1 | 12/2013 | Polisetty et al. |
| 2014/0168901 | A1* | 6/2014 | Ide .................... H05K 7/20927 361/717 |
| 2014/0190665 | A1 | 7/2014 | Joshi et al. |
| 2014/0192485 | A1 | 7/2014 | Rau et al. |
| 2015/0009631 | A1 | 1/2015 | Joshi |
| 2015/0043164 | A1 | 2/2015 | Joshi |
| 2017/0055378 | A1 | 2/2017 | Zhou et al. |
| 2017/0092565 | A1 | 3/2017 | Chen et al. |
| 2017/0094837 | A1 | 3/2017 | Joshi et al. |
| 2018/0103560 | A1 | 4/2018 | Bouras |
| 2018/0145010 | A1 | 5/2018 | Fukuoka et al. |

* cited by examiner

LIQUID COOLING OF HIGH CURRENT DEVICES IN POWER FLOW CONTROL SYSTEMS

CROSS REFERENCE TO RELATED APPLICATIONS

This application is a divisional of U.S. patent application Ser. No. 16/948,523 filed on Sep. 22, 2020, which claims the benefit of U.S. Provisional Application No. 62/987,221 filed on Mar. 9, 2020, the disclosures of which are incorporated herein by reference in their entirety.

TECHNICAL FIELD

The subject technology of this disclosure relates generally to power flow control systems. More particularly, the subject technology relates to a liquid cooling block and to cooling of a power flow control unit using a liquid cooling block.

BACKGROUND

Modern-day distributed power generation and distribution systems have introduced multi-generator grids and new modes of operation. These new modes of operation may introduce power electronic (PE) converters, such as power flow control systems used to inject reactive impedance or reactive power into transmission lines. These systems may include high current devices that generate high thermal loads. To date, power flow control systems have typically used air cooling for heat dissipation. There is a need in the art for liquid cooling configurations adapted for use in power flow control systems.

SUMMARY

A first aspect of the subject technology relates to a liquid cooling block (LCB). The LCB includes input and output ports and a closed-circuit fluid assembly coupled to the ports. A pump is used to circulate liquid coolant within the LCB and within the closed-circuit fluid assembly, and a showerhead is provided with an array of jetting apertures. A cooling plate is provided, and an electronic assembly is thermally coupled to the cooling plate. Jets of liquid coolant created by the jetting apertures may impinge directly onto the cooling plate or onto a metal member thermally coupled to the cooling plate.

A second aspect of the subject technology relates to a power flow control unit. The power flow control unit includes a bank of capacitors connected in parallel to form a DC capacitor, a LCB within which liquid coolant circulates, and a high power switching assembly thermally coupled to the LCB and electrically coupled to the DC capacitor.

A third aspect of the subject technology relates to a power flow control system including an enclosure and several power flow control units contained within the enclosure. Each power flow control unit may include a bank of capacitors connected in parallel to form a DC capacitor, a LCB within which liquid coolant circulates, and a power switching assembly thermally coupled to the LCB and electrically coupled to the DC capacitor. The power flow control system may be configured to inject reactive power of at least 10 MVAr (mega-volt-amp reactive) into a power transmission line.

BRIEF DESCRIPTION OF THE DRAWINGS

The accompanying drawings are provided together with the following description of various aspects and embodiments of the subject technology for a better comprehension of the invention. The drawings and the embodiments are illustrative of the invention and are not intended to limit the scope of the invention. It is understood that a person of ordinary skill in the art may modify the drawings to generate drawings of other embodiments that would still fall within the scope of the invention.

DETAILED DESCRIPTION

Figure 1:
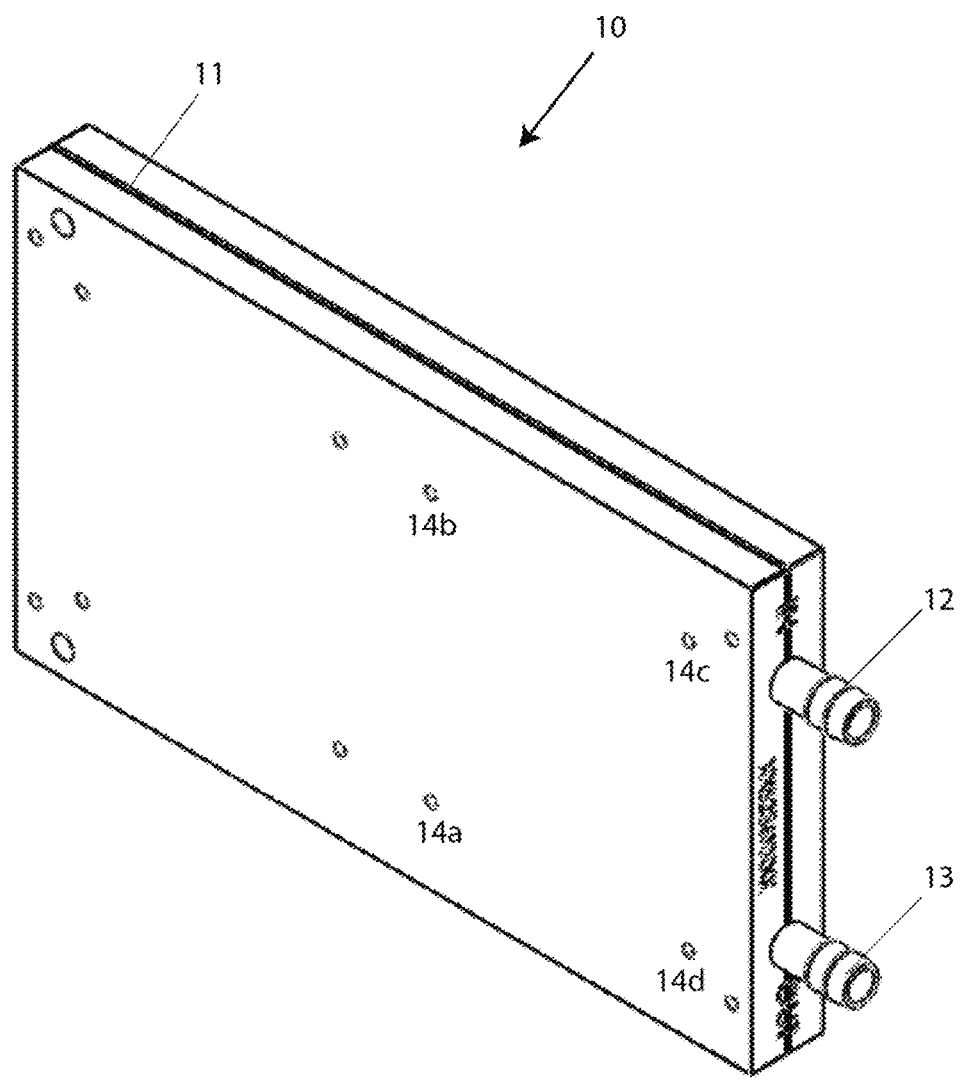
FIG. 1 is a perspective drawing of a liquid cooling block in an embodiment of the present disclosure.

Examples of various aspects and variations of the subject technology are described herein and illustrated in the accompanying drawings. Objects, features, and advantages of the invention will be apparent from the following detailed description taken in conjunction with the accompanying drawings. While various embodiments of the subject technology are described, the following description is not intended to limit the invention to these embodiments, but rather to enable a person skilled in the art to make and use this invention.

A modular liquid cooling block (LCB) is described for cooling high current devices deployed in power flow control systems. The LCB may have separate shower heads which may be configured for direct impingement, indirect impingement, or parallel flow cooling configurations. Voltage isolation of liquid cooling blocks with associated equipment enables series or parallel connected power flow control units to inject substantial reactive power that may be configurable into a power transmission line. Associated power flow control systems that include the serial or parallel connected power flow control units are monitored for temperature, flow rate and pressure gradient. Redundant pumps and fan radiators contribute to reliable operation. Automatic shutdown and alarm are provided.

A first aspect of the present disclosure relates to a LCB that includes input and output ports and a closed-circuit fluid assembly coupled to the ports. A pump is used to circulate liquid coolant within the LCB and a showerhead is provided with an array of jetting apertures. A cooling plate is provided, and an electronic assembly is thermally coupled to the cooling plate. Jets of liquid coolant created by the jetting apertures impinge directly onto the cooling plate or onto a metal member thermally coupled to the cooling plate. The cooling plate may be patterned with three-dimensional features to improve cooling performance, and the cooling plates may be interchangeable to provide variations in the cooling plate. The LCB may have a clamshell construction wherein two halves of a fluid chamber are welded together. Other joining methods such as friction stir welding may be used. The electronic assembly thermally coupled to the cooling plate may comprise high-current devices, and the high-current devices may be insulated gate bipolar transistors (IGBTs). In one embodiment, the showerhead may comprise a slot through which liquid coolant is injected, rather than an array of jetting apertures. The LCB may be thermally coupled to a fan radiator for radiating heat to an air ambient. The liquid coolant may comprise mixtures of water, ethylene glycol, and poly-ethylene glycol. The water may be distilled water or de-ionized water.

A second aspect of the present disclosure relates to a power flow control unit which includes a bank of capacitors connected in parallel to form a DC capacitor, a LCB within which liquid coolant circulates, and a high power switching assembly thermally coupled to the LCB and electrically coupled to the DC capacitor. The power flow control unit may be configured to inject 1 MVA (mega-volt-amp) of reactive power (or 1 MVAr) into a power transmission line. It may employ replaceable components and have an operational lifetime of at least ten years. The required volume of liquid coolant may be less than 10 liters. The liquid coolant may be drainable and replaceable and have an operating pressure of less than 4 bars. The LCB may be configured to operate in a range of ambient temperature from −40° C. to 50° C.

A third aspect of the present disclosure relates to a power flow control system comprising an enclosure and several power flow control units contained within the enclosure. Each power flow control unit may include a bank of capacitors connected in parallel to form a DC capacitor, a LCB within which liquid coolant circulates, and a power switching assembly thermally coupled to the LCB and electrically coupled to the DC capacitor. The power flow control system may be configured to inject reactive power of at least 10 MVAr into a power transmission line. The power flow control system may further include a bypass circuit connected in parallel, and configured to carry a fault current in excess of the normal operating current of the power flow control system. Each power flow control unit may be voltage isolated from other power flow control units in the power flow control system.

FIG. 1 illustrates a LCB 10 in an embodiment of the present disclosure. LCB 10 has a clam shell construction, where two halves may be joined together to form interface 11. Each half of the LCB is machine accessible for machining the shaped internal cavities. A water inlet port 12 and a water outlet port 13 are shown. Two sets of four threaded mounting holes, 14a, 14b, 14c and 14d are provided on each side of LCB 10 for mounting electronic modules to be cooled. An alternative manufacturing method is to fabricate a LCB using polymer material and judiciously place metal frames to which cooling plates may be attached to provide thermal interfaces to the electronic modules.

Figure 2:
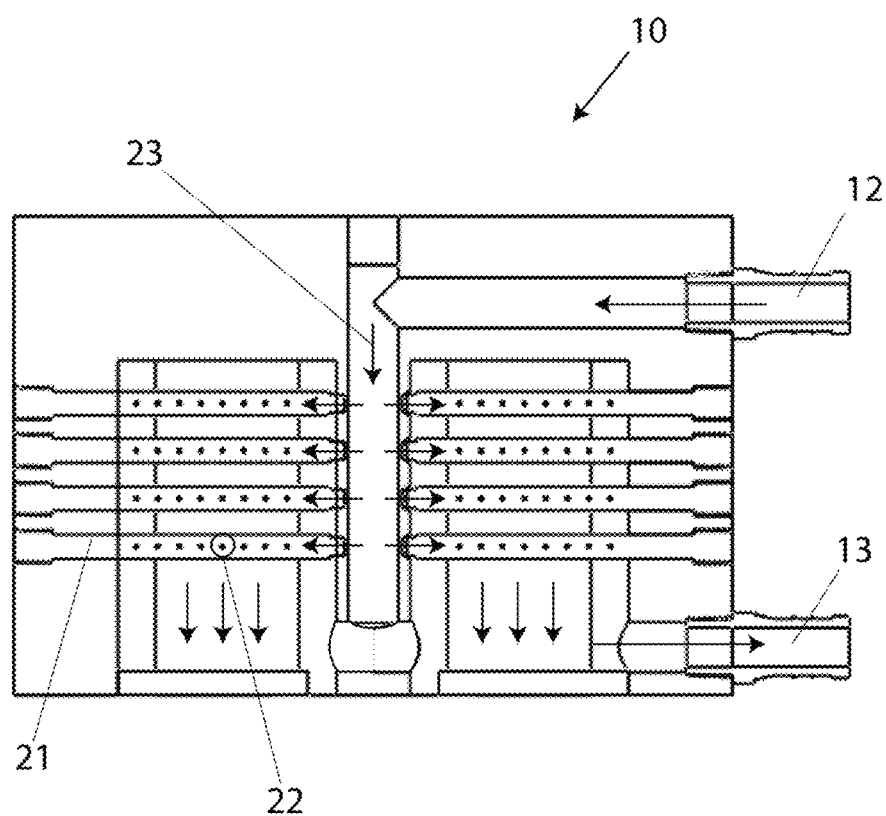
FIG. 2 is a cross-sectional view of a liquid cooling block, showing coolant circulation paths according to one embodiment.

FIG. 2 illustrates in cross-section the flow of liquid coolant inside an LCB according to one embodiment. Coolant entering at inlet port 12 is routed to an array of showerheads 21. Each showerhead includes an array of jetting apertures 22, such as nine jetting apertures per showerhead shown in the figure. After jets of coolant have impinged on a cooling plate, or on a metal wall coupled to a cooling plate, the coolant is routed to outlet port 13. Arrows 23 depict the directional flow of the liquid coolant. Other embodiments of the LCB 10 may include different types of nozzles, active flow control circuits, or other types of channel assemblies to increase the flow rate of the liquid coolant near critical thermal junctions, or to increase the surface area contacted by the liquid coolant.

Liquid cooling blocks of the present disclosure may be configured to provide individualized flow channels using direct impingement, indirect impingement, parallel flow, or combinations thereof. For direct impingement the jets of coolant fluid impinge directly on a cooling plate. For indirect impingement the jets of coolant fluid impinge on a metal wall of a fluid chamber which is thermally coupled to a cooling plate. For parallel flow the coolant fluid exits from a slot rather than a jetting aperture and passes over a cooling plate or a metal wall thermally coupled to a cooling plate with parallel flow. In each of these three cases the cooling plate is thermally coupled to an electronic module with a low thermal resistance between them.

Figure 3:
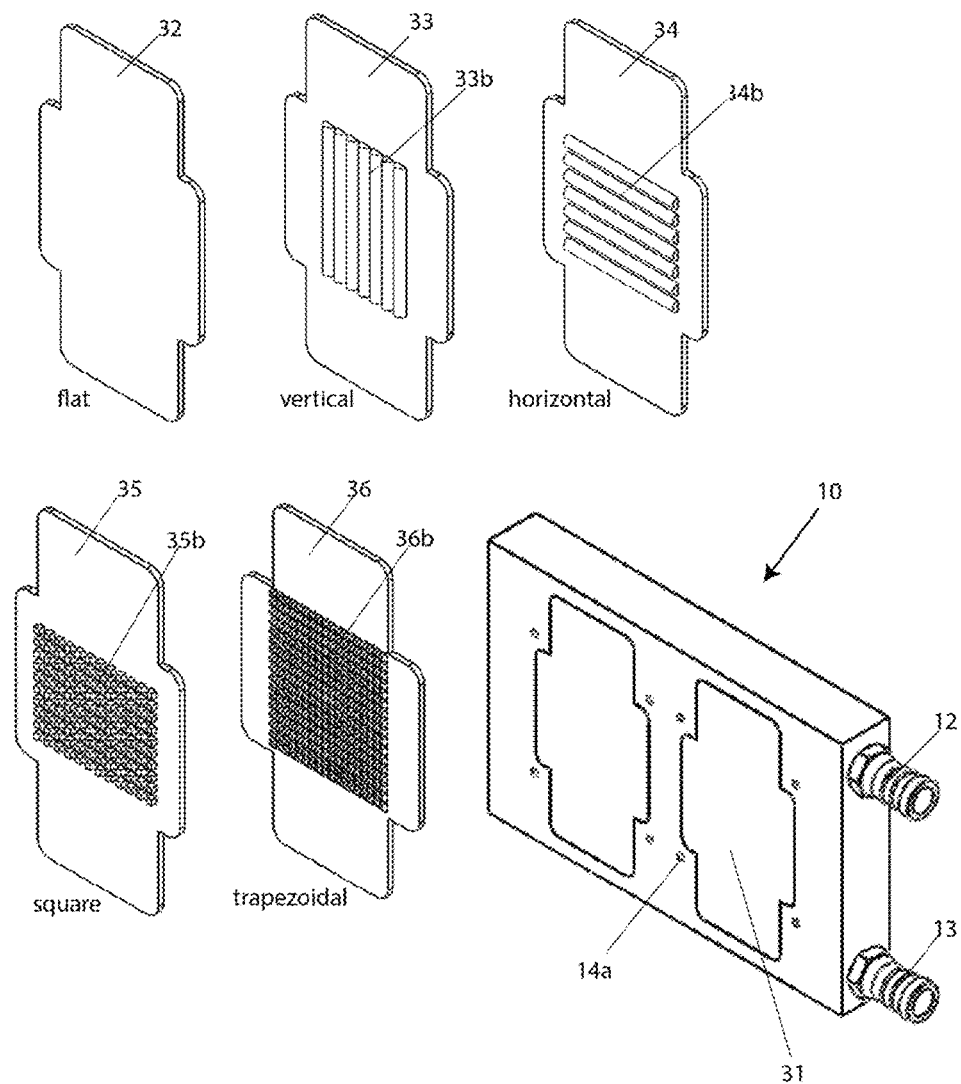
FIG. 3 depicts optional surface configurations for cooling plates used in liquid cooling blocks according to some embodiments.

FIG. 3 shows surface configurations for cooling plates (which may be optional in some embodiments) together with location 31 of a coolant plate integrated with LCB 10 according to some embodiments. The surface features shown in the examples face the inside of LCB 10, for interaction with the coolant via jet impingement or parallel flow as described. A planar face of each coolant plate faces outward as shown, for interfacing (e.g., thermally coupled) with an electronic module that comprises a matching planar face. An unpatterned or flat cooling plate is shown 32, together with a cooling plate 33 having vertically oriented features or patterns 33b (e.g., semi-cylinder patterns) embossed thereon, plate 34 having horizontally oriented features or patterns 34b (e.g., semi-cylinder patterns) embossed thereon, cooling plate 35 having features or patterns 35b (e.g., an array of square or cube shaped patterns) embossed thereon, and cooling plate 36 having features or patterns 36b (e.g., an array of trapezoidal patterns) embossed thereon. Embodiments of the cooling plates may have embossed features of other geometrical shapes. The embossed features 33b, 34b, 35b, 36b increase the surface area on which the coolant jets impinge or otherwise flow, thereby leading to improved heat transfer.

Figure 4:
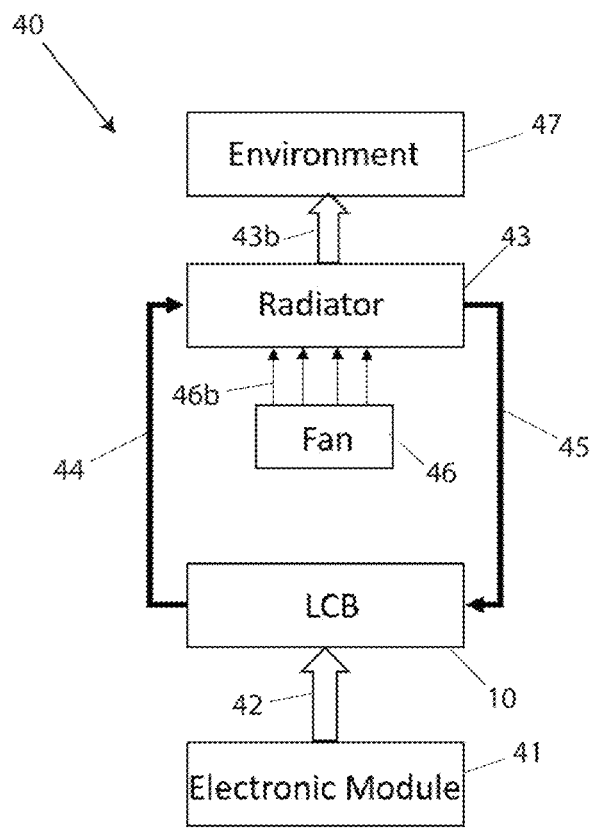
FIG. 4 is a schematic of a thermal architecture used for cooling an inverter module of a power flow control unit according to one embodiment.

FIG. 4 illustrates a thermal subsystem 40 of the present disclosure for cooling an electronic module 41 according to one embodiment. Electronic module 41 generates heat 42 that is transferred to LCB 10. LCB 10 is coupled to a radiator 43 through a hot coolant link 44 and a cold coolant link 45. A fan 46 directs air 46b onto radiator 43, and radiator 43 transfers heat 43b to the ambient environment 47. The liquid coolant may be water or a mixture of water and ethylene glycol or polyethylene glycol for example. The plumbing of thermal subsystem 40 may comprise brazed assemblies that can withstand an operating pressure of 2-5 bar for example. In one embodiment, the liquid coolant may be drainable and replaceable and have an operating pressure of less than 4 bars. Such brazed assemblies may be pressure tested and may have a lifetime greater than 10 years. The total volume of liquid coolant in thermal subsystem 40 may be 4-10 liters for example and the flow rate may be 10-20 liters per minute to support a power flow control unit 50 as will be described in reference to FIG. 5. In some embodiments, sensors of thermal subsystem 40 may monitor the pressure gradient, flow rate, and temperature of the liquid coolant to adaptively control the flow rate or temperature of the liquid coolant via fan 46 or pumps.

Temperature sensors such as negative temperature coefficient thermistors (NTCs) may be used to sense the temperature of the liquid coolant and may be coupled to an alarm system, to be activated if the coolant temperature exceeds a predetermined threshold. Thermal subsystem 40 may be configured with redundant pumps for improved long-term maintainability and reliability. Tubing used to circulate the coolant may be made of flexible materials, such as silicone. Thermal subsystem 40 comprises a closed-circuit fluid assembly. The thermal architecture of thermal subsystem 40 may be applied to any closed loop coolant system coupled to any electronic module 41. In a power flow control system of the present disclosure electronic module 41 is configured as an inverter module containing high-power switching devices and DC capacitors for injecting reactive power onto a power transmission line.

Figure 5:
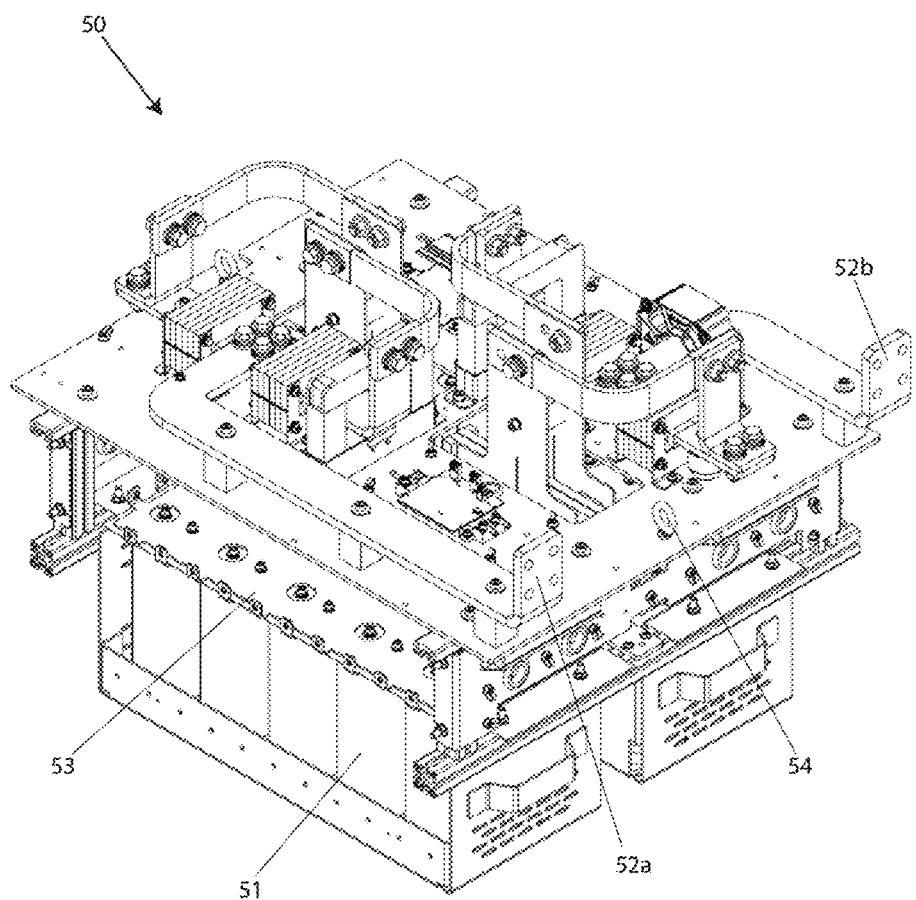
FIG. 5 is a perspective drawing of a power flow control unit configured to inject 1 MVAr into a power transmission line according to one embodiment.

FIG. 5 illustrates a compact power flow control unit 50 in an embodiment of the present disclosure that includes liquid cooling. The power flow control unit 50 may include at least one electronic module 41 and at least one LCB 10 of FIG. 4. A capacitor 51 is shown, one of a bank of capacitors that comprise a DC capacitor of the power flow control unit 50. AC bus bars 52a, 52b are configured to connect to a power transmission line. A DC bus bar 53 is shown coupled to the DC capacitor. Embedded within power flow control unit 50 may be a pair of liquid cooling blocks, each of which may be LCB 10 as described. A hoist ring 54 is also shown. Power flow control unit 50 may be configured to inject reactive power of 1 MVAr into a power transmission line for example.

Figure 6:
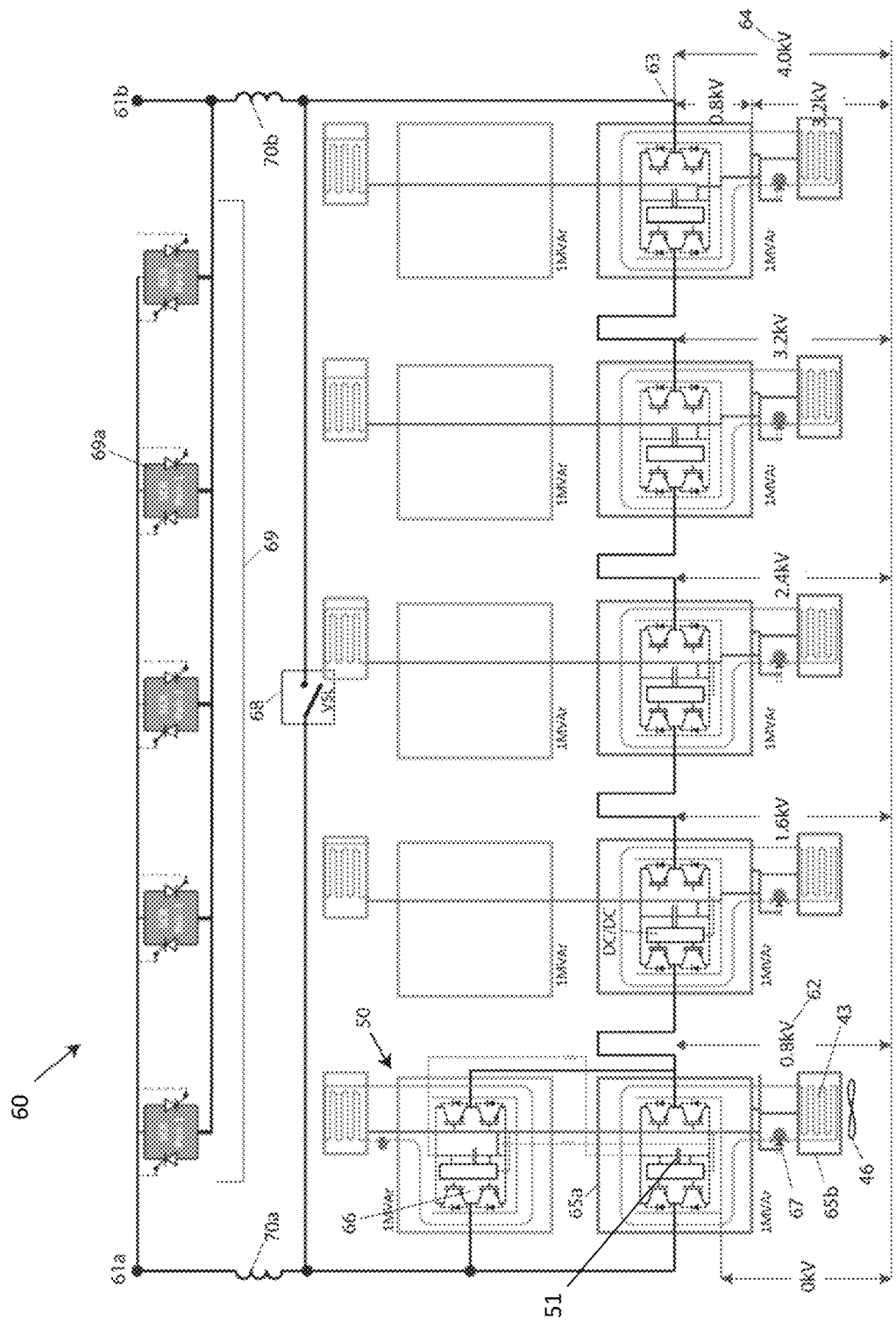
FIG. 6 shows the series and parallel connection of isolated power flow control units, together with a bypass circuit according to one embodiment.

FIG. 6 illustrates a power flow control system 60 that includes ten power flow control units 50 described in reference to FIG. 5 according to one embodiment. System 60 may include more or less than ten power flow control units 50 in some embodiments. Power flow control system 60 may be configured to provide 10 MVAr of reactive power for injection into a power transmission line, for example. Each power flow control unit 50 may be configured to inject 1 MVAr of reactive power. Connections 61a and 61b to the power transmission line are shown. The ten power flow control units 50 are arranged with two parallel units comprising a dual unit, and five dual units connected in series. As shown, voltage isolation of 0.8 kV 62 is provided between each dual unit and an enclosure of power flow control system 60; this may enable series connection of the dual units as shown to provide the desired levels of injection of reactive power into a power transmission line connected between nodes 61a and 61b. At node 63 the level of voltage isolation is 4.0 kV 64 as shown between the last of the five serially-connected dual units and the enclosure.

Isolated assemblies 65a and 65b are shown. Isolated assembly 65a may be power flow control unit 50 described in reference to FIG. 5. Isolated assembly 65a includes a power switching assembly 66 that typically comprises a bank of four insulated gate bipolar transistors (IGBTs) as shown for injecting reactive power from the DC capacitor 51 (a bank of parallel-connected DC capacitors of the power flow control unit 50 in reference to FIG. 5) onto the power transmission line. Each of the IGBTs depicted may comprise two or more IGBT chips connected in a bridge configuration. Isolated assembly 65b comprises a subset of the thermal cooling equipment described in reference to FIG. 4 including a radiator 43, a fan 46 and a pump 67. LCBs 10 are embedded within the power flow control units 50 as described in reference to FIG. 5.

Isolated assemblies 65a and 65b may comprise structural members fabricated using non-electrically conductive materials such as fiber reinforced plastic (FRP). One version of FRP comprises a polyester resin and has an operating temperature up to around 140° F. Another version of FRP comprises an epoxy resin and has an operating temperature up to around 240° F. Although not required for voltage isolation, tubing for circulating the coolant may comprise a non-electrically conductive material such as silicone. A rail system may be used for mounting the various modules of power flow control system 60, enabling convenient access for maintenance and replacement, as necessary. Bypass circuits may also be included, such as a vacuum switched link (VSL) 68 for providing an alternate path for bypassing a fault current or for placing power flow control system 60 into monitor mode, in order to perform maintenance for example. Current limiting chokes 70a and 70b may be provided as shown. A bank 69 of SCRs (silicon-controlled rectifiers) 69a may be provided in parallel as shown, used for bypassing high currents during fault conditions on the associated power transmission line. Each SCR 69a must be capable of withstanding the isolation voltage 64, which may be as high as 4.0 kV as shown.

Figure 7:
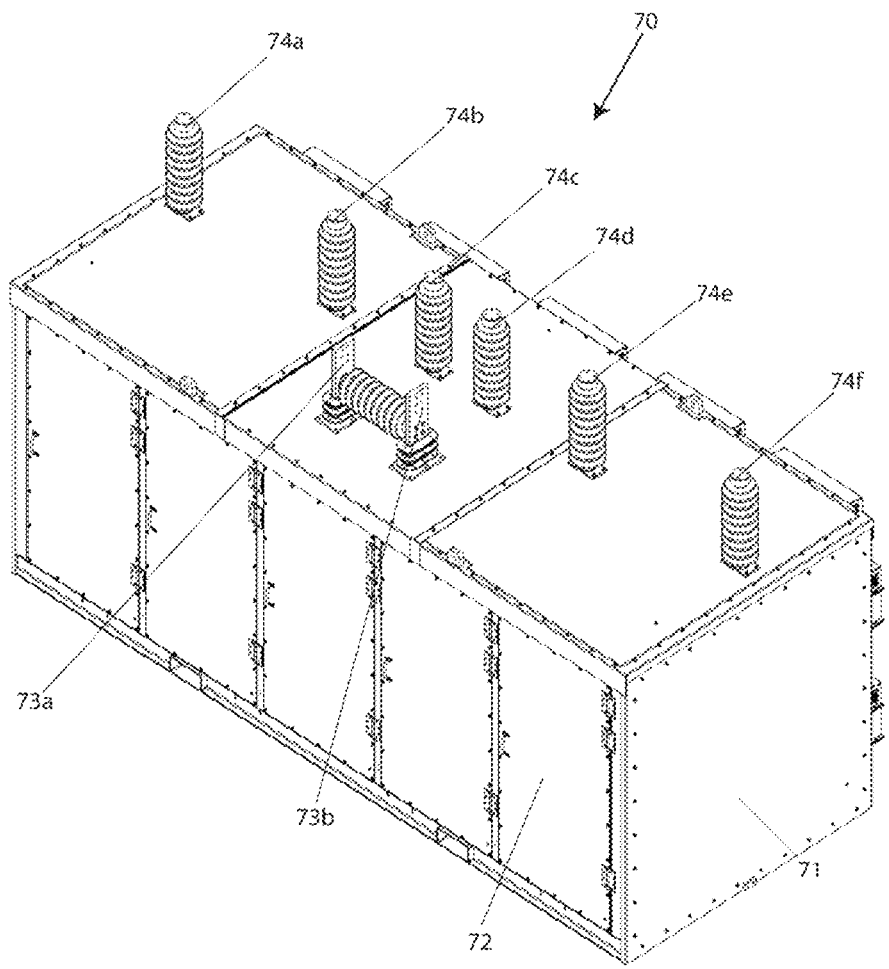
FIG. 7 illustrates an enclosed power flow control system configured to inject 10 MVAr into a power transmission line according to one embodiment.

FIG. 7 depicts power flow control system 60 configured as an enclosed system 70 according to one embodiment. System 70 includes an enclosure 71 having doors 72 for accessing the equipment modules. The modules may be mounted on rails for convenient access. Nodes 73a, 73b are providing for connection to a power transmission line. Nodes 74a through 74f are provided for connecting the voltage-isolated dual power flow control units depicted in FIG. 6.

Embodiments of the disclosure described herein may be applied to stand-alone liquid cooled electronic modules, or to liquid cooled power flow control units and systems. The devices, processing, and logic described above may be implemented in many different ways and in many different combinations of hardware and software. For example, electronic circuitry or a controller may be configured with hardware and/or firmware to execute the various functions described. All or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. The implementations may be distributed as circuitry among multiple system components, such as among multiple processors and memories, optionally including multiple distributed processing systems.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium.

The foregoing description, for purposes of explanation, uses specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications. They thereby enable others skilled in the art to best utilize the invention and various embodiments with various modifications as are suited to the particular use contemplated. For example, while the LCB has been illustrated in conjunction with an inverter of a power flow control unit used to inject reactive power from a DC capacitor into a power transmission line, the principles described are equally applicable to liquid cooling of other types of power electronic converters. The examples are thus illustrative and non-limiting. It is intended that the following claims and their equivalents define the scope of the invention.

What is claimed is:

1. An apparatus of a power flow control unit comprising:
   a plurality of capacitors connected in parallel to form a DC capacitor;
   at least one liquid cooling block configured to recirculate a liquid coolant; and
   at least one high-power switching assembly thermally coupled to the at least one liquid cooling block and electrically connected to the DC capacitor, wherein the power flow control unit is configured to inject at least 1 MVA (mega-volt-amp) of reactive power into a power transmission line.

2. The apparatus of claim 1, wherein the power flow control unit is configured of replaceable components that have an operational lifetime of at least years.

3. The apparatus of claim 1, wherein a volume of the liquid coolant is less than 10 liters.

4. The apparatus of claim 1, wherein the power flow control unit is configured to operate in a range of ambient temperature from −40° C. to 50° C.

5. The apparatus of claim 1, wherein a pressure of the liquid coolant does not exceed 4 bar.

6. The apparatus of claim 1, wherein the liquid coolant is replaceable.

7. A power flow control system comprising:
   an enclosure;
   a plurality of power flow control units contained within the enclosure, each power flow control unit comprising:
      a plurality of capacitors connected in parallel to form a DC capacitor;
      at least one liquid cooling block configured to recirculate a liquid coolant; and
      at least one high-power switching assembly thermally coupled to the at least one liquid cooling block and electrically connected to the DC capacitor;
   wherein the power flow control units are configured to inject reactive power of at least 10 MVA (mega-volt-amp) into a power transmission line.

8. The power flow control system of claim 7, further comprising a bypass circuit connected in parallel, wherein bypass circuit is configured to carry a fault current in excess of a normal operating current of the power flow control system.

9. The power flow control system of claim 7, wherein each of the plurality of power flow control units is voltage isolated from the enclosure.

* * * * *